United States Patent
Huang et al.

(10) Patent No.: US 8,143,665 B2
(45) Date of Patent: Mar. 27, 2012

(54) MEMORY ARRAY AND METHOD FOR MANUFACTURING AND OPERATING THE SAME

(75) Inventors: Jyun-Siang Huang, Hsinchu (TW); Wen-Jer Tsai, Hsinchu (TW); Tien-Fan Ou, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 118 days.

(21) Appl. No.: 12/352,947

(22) Filed: Jan. 13, 2009

(65) Prior Publication Data

US 2010/0176437 A1   Jul. 15, 2010

(51) Int. Cl.
*H01L 29/788* (2006.01)

(52) U.S. Cl. ............... 257/321; 257/322; 257/E21.423; 257/E21.679

(58) Field of Classification Search ................. 257/321, 257/322

See application file for complete search history.

(56) References Cited

U.S. PATENT DOCUMENTS

| | | | |
|---|---|---|---|
| 6,008,084 A | 12/1999 | Sung | |
| 6,690,601 B2 | 2/2004 | Yeh et al. | |
| 6,710,391 B2 | 3/2004 | Houston | |
| 6,784,061 B1 | 8/2004 | Yang et al. | |
| 6,878,988 B1 * | 4/2005 | Lee et al. | 257/324 |
| 2004/0251487 A1 * | 12/2004 | Wu et al. | 257/315 |
| 2007/0018218 A1 * | 1/2007 | Kretz et al. | 257/296 |
| 2007/0131999 A1 | 6/2007 | Tsai et al. | |
| 2007/0230247 A1 * | 10/2007 | Hsu et al. | 365/185.14 |
| 2007/0247913 A1 * | 10/2007 | Park et al. | 365/185.17 |
| 2008/0084745 A1 * | 4/2008 | Walker | 365/185.17 |

* cited by examiner

*Primary Examiner* — Thao Le
*Assistant Examiner* — Allen Parker
(74) *Attorney, Agent, or Firm* — J.C. Patents (57) ABSTRACT

The invention provides a memory array. The memory array comprises a substrate, a plurality of word lines, a charge trapping structure, a plurality of trench channels and a plurality of bit lines. The word lines are located over the substrate and the word lines are parallel to each other. The charge trapping structure covers a surface of each of the word lines. The trench channels are located over the substrate and the word lines and the trench channels are alternatively arranged and each trench channel is separated from the adjacent word lines by the charge trapping structure. The bit lines are located over the word lines and each bit line is across over each of the word lines and each trench channel is electrically coupled to the bit lines.

8 Claims, 11 Drawing Sheets

MEMORY ARRAY AND METHOD FOR MANUFACTURING AND OPERATING THE SAME

BACKGROUND OF THE INVENTION

1. Field of the Invention

This invention relates in general to a memory array and methods for manufacturing and operating thereof and more specifically relates to a memory array with trench channels and methods for manufacturing and operating the same.

2. Description of Related Art

As memory devices continue to reduce in size along with the increase in the integration of integrated circuits, the dimension of the buried bit line needs to be reduced correspondingly. Consequently, the punch-through leakage in a memory cell becomes worse and the bit line resistance becomes large. By increasing the junction depth and doping concentration of the bit line to resolve the problem of the increase of the bit line resistance, not only short channel effect may develop, the problem of punch-through leakage may result since the distance between the neighboring bit lines reduces. However, a high dopant concentration can not be used to form a shallow junction bit line to prevent the short channel effect and then the punch-through leakage problem due to a deep junction depth and channel length reduced, the problem of overloading the bit line remains unresolved due to the limitation of doping concentration. Due to above-mentioned, the worse punch-though leakage between the neighboring bit lines and large bit line resistance may still occur which leads to poor operation speed and efficiency of the device. Furthermore, the reliability and the yield of the entire process may be affected.

SUMMARY OF THE INVENTION

The invention provides a memory array with a relatively small bit line resistance.

The invention also provides a method for forming a memory array having a memory cell with relatively longer channel length in the limited size of the memory cell.

The invention provides a memory array. The memory array comprises a plurality of word lines, a charge trapping structure, a plurality of trench channels and a plurality of bit lines. The charge trapping structure covers a surface of each of the word lines. The word lines and the trench channels are alternatively arranged and each trench channel is separated from the adjacent word lines by the charge trapping structure. The bit lines are located across the word lines and the trench channels are electrically coupled to the bit lines.

According to one embodiment of the invention, the word lines are isolated from the substrate by a dielectric layer formed on the substrate.

According to one embodiment of the invention, the trench channels are isolated from the substrate by the dielectric layer.

According to one embodiment of the invention, the material of the dielectric layer includes silicon oxide.

According to one embodiment of the invention, a top level of each trench channel is lower than a top level of each word line.

According to one embodiment of the invention, the charge trapping structure includes a charge trapping layer.

According to one embodiment of the invention, the material of the charge trapping layer includes a silicon nitride.

According to one embodiment of the invention, the conductive type of the bit lines is different from the conductive type of the trench channels.

The invention also provides a memory cell. The memory cell comprises a word line, a charge trapping structure, a pair of trench channels, a first bit line and a second bit line. The word line has a first end and a second end. The charge trapping structure covers both sidewalls of the word line. The trench channels are located on the charge trapping structure at opposite sidewalls of the word line respectively and near a lower portion of the word line. The first bit line and the second bit line are across the word line. Further, the first bit line electrically couples the trench channels adjacent to the first end of the word line and the second bit line electrically couples the trench channels adjacent to the second end of the word line.

According to one embodiment of the invention, the word line is isolated from the substrate by a dielectric layer formed on the substrate.

According to one embodiment of the invention, the material of the dielectric layer is silicon oxide.

According to one embodiment of the invention, the charge trapping structure includes an oxide layer/charge trapping layer.

According to one embodiment of the invention, the material of the charge trapping layer is silicon nitride.

According to one embodiment of the invention, the conductive type of the first bit line and the second bit line is different from the conductive type of the trench channels.

According to one embodiment of the invention, each of the first bit line and the second bit line electrically couples each trench channel through an extension portion of each of the first bit line and the second bit line located on each sidewall of the word line.

According to one embodiment of the invention, for each extension portion of the bit line, there is a P-N junction in the extension portion of the bit line.

According to one embodiment of the invention, for each extension portion of each of the first bit line and the second bit line, there is a P-N junction located between the extension portion of the bit line and the trench channel.

The invention further provides a method for forming a memory array. The method comprises steps of providing a substrate having a first dielectric layer formed thereon. Then, a plurality of word lines are formed on the first dielectric layer, wherein the word lines are parallel to each other and the adjacent word lines are separated from each other by a trench. A charge trapping structure is formed over the substrate, wherein the charge trapping structure is conformal to the word lines and the trenches. Moreover, a conductive layer with a first conductive type is formed over the substrate so as to fill up the trenches between the word lines. The conductive layer is patterned so as to form a plurality of trench channels in the trenches along a longitudinal axis of the word lines respectively and to form a plurality of conductive lines over tops of the word lines and across the word lines respectively. A top level of each trench channel is lower than a top level of each word line and each conductive line has a plurality of conductive extensions extend downward in the trenches so as to electrically couple the conductive lines to the trench channels respectively. Thereafter, a second dielectric layer is formed over the substrate to cover the conductive lines. Then, a planarization process is performed to remove a portion of the second dielectric layer until the top surfaces of the conductive lines are exposed. An ion implantation process is performed to transfer the conductive lines into a plurality of bit lines with a second conductive type respectively.

According to one embodiment of the invention, the first conductive type is different from the second conductive type.

According to one embodiment of the invention, after the ion implantation process is performed, a P-N junction is formed in each conductive extension.

According to one embodiment of the invention, after the ion implantation process is performed, a P-N junction is formed between each of the conductive extensions and the trench channel.

According to one embodiment of the invention, after the ion implantation process is performed, the conductive type of a portion of each conductive extension near the corresponding bit line is transferred into the second conductive type.

According to one embodiment of the invention, the charge trapping structure includes silicon oxide/silicon nitride/silicon oxide layer.

According to one embodiment of the invention, the second dielectric layer is made of silicon oxide.

According to one embodiment of the invention, the conductive layer is made of polysilicon.

According to one embodiment of the invention, the planarization process includes a chemical mechanical polishing.

The invention provides a method for programming a memory cell. The memory cell includes a word line structure located over a substrate and two trench channels located on opposite sidewalls of the word line structure respectively. The memory cell further includes a first bit line and a second bit line located over the word line structure and across the word line structure. Also, the first bit line is electrically coupled to the trench channels near a first end of the word line structure and the second bit line is electrically coupled to the trench channels near a second end of the word line structure. Moreover, the word line structure possesses a first storage region and a second storage region located on opposite sidewalls of the word line structure adjacent to the first end respectively. However, the first and the second storage region are the same bit that is the first bit. The word line structure further possesses a third storage region and a fourth storage region located on opposite sidewalls of the word line structure adjacent to the second end respectively. However, the third and the fourth storage region are the same bit that is the second bit. The method comprises steps of applying a first positive voltage on the word line structure and applying a second positive bias on the first bit line and grounding the second bit line. The channel hot electrons are generated from the first bit line to the second bit line to inject into the first and the second storage region at the same time near the first end of the word line structure when the memory cell is programmed.

According to one embodiment of the invention, the injected carriers are stored in the first storage region and the second storage region, respectively.

According to one embodiment of the invention, the memory cell is programmed in a way of channel hot electron injection programming process while the first voltage is a positive bias about 9~13 voltage and, the first bit line is applied by a second positive bias and the second bit line is grounded.

The invention further provides a method for performing an erasing operation on a memory cell. The memory cell includes a word line structure located over a substrate and two trench channels located on opposite sidewalls of the word line structure respectively. The memory cell further includes a first bit line and a second bit line located over the word line structure and across the word line structure. Also, the first bit line is electrically coupled to the trench channels near a first end of the word line structure and the second bit line is electrically coupled to the trench channels near a second end of the word line structure. Moreover, the word line structure possesses a first storage region and a second storage region located on opposite sidewalls of the word line structure adjacent to the first end respectively. However, the first and the second storage region are the same bit that is the first bit. The word line structure further possesses a third storage region and a fourth storage region located on opposite sidewalls of the word line structure adjacent to the second end respectively. However, the third and the fourth storage region are the same bit that is the second bit. The method comprises steps of applying a negative voltage on the word line structure and, applying a positive voltage on the first bit line and grounding the second bit line. The band-to-band hot hole are generated around the junction of the first bit line or the second bit line to inject into the first and the second storage region at the same time near the first end of the word line structure when the memory cell is erased.

According to one embodiment of the invention, the memory cell is erased in a way of band-to-band-tunneling hot hole process while the negative voltage is about −9−5~−10 voltage.

The invention provides a method for reading a memory cell. The memory cell includes a word line structure located over a substrate and two trench channels located on opposite sidewalls of the word line structure respectively. The memory cell further includes a first bit line and a second bit line located over the word line structure and across the word line structure. Also, the first bit line is electrically coupled to the trench channels near a first end of the word line structure and the second bit line is electrically coupled to the trench channels near a second end of the word line structure. Moreover, the word line structure possesses a first storage region and a second storage region located on opposite sidewalls of the word line structure adjacent to the first end respectively. However, the first and the second storage region are the same bit that is the first bit. The word line structure further possesses a third storage region and a fourth storage region located on opposite sidewalls of the word line structure adjacent to the second end respectively. However, the third and the fourth storage region are the same bit that is the second bit. The method comprises steps of applying a fifth positive voltage on the word line structure, applying a sixth positive voltage on the second bit line and grounding on the first bit line and applying a first reverse bias from the first bit line to the second bit line so as to read a storage state of the first storage region and the second storage region.

According to one embodiment of the invention, the memory cell is read in a way of reverse read process while the fifth voltage is a positive bias of about voltage and the first reverse bias is accomplished by grounding the first bit line, and applying a positive voltage on the second bit line.

In the present invention, by controlling the position of the P-N junction in the conductive extension, the channel length can be effectively elongated in a restricted and small size of memory cell. By adopting the source/drain (i.e. the portion of the conductive extension above the P-N junction) raised above the trench channel, the unexpected punch through is no longer a problem even if the ion implantation dosage for forming the bit lines is increased in such limited size of memory cell in order to decrease the bit line resistance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1D-1 is a schematic cross-sectional view along the line I-I on FIG. 1D.

FIG. 1E-1 is a schematic cross-sectional view along the line II-II on FIG. 1E.

FIG. 1E-2 is a schematic cross-sectional view along the line III-III on FIG. 1E.

FIG. 1F-1 is a schematic cross-sectional view along the line IV-IV on FIG. 1F

FIG. 1F-2 is a schematic cross-sectional view along the line V-V on FIG. 1F.

FIG. 1F-3 is a schematic cross-sectional view along the line VI-VI on FIG. 1F.

FIG. 1F-4 is a schematic cross-sectional view showing the locations of the P-N junctions located between the conductive extension and the trench channel according to another embodiment of the present invention.

DESCRIPTION OF THE PREFERRED EMBODIMENT

Figure 1A:
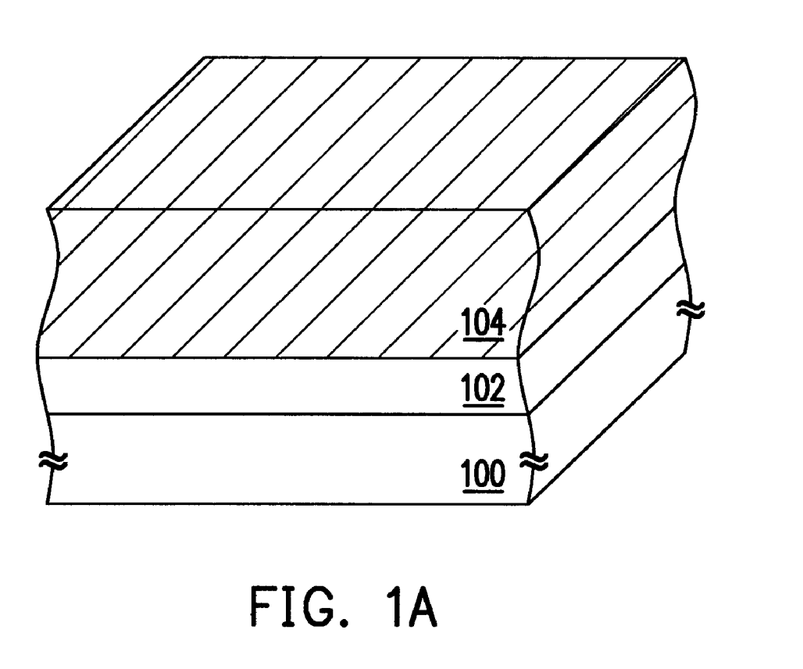
FIGS. 1A through 1F are a schematic three-dimensional view illustrating a method for forming a memory array according to one embodiment of the present invention.

FIGS. 1A through 1F are a schematic three-dimensional view illustrating a method for forming a memory array according to one embodiment of the present invention. As shown in FIG. 1A, a substrate 100 is provided. The substrate 100 has a dielectric layer 102 formed thereon. The substrate 100 can be, for example but not limited to, a silicon substrate. The dielectric layer 102 can be, for example but not limited to, made of silicon oxide. The method for forming the dielectric layer 102 can be, for example but not limited to, chemical vapor deposition (CVD). Furthermore, a conductive layer 104 is formed on the dielectric layer 102. The conductive layer 104 can be, for example but not limited to, made of in-situ doped polysilicon. Alternatively, the method for forming the conductive layer 104 comprises steps of forming a polysilicon layer and then performing an ion implantation process for implanting ions into the polysilicon layer.

Figure 1B:
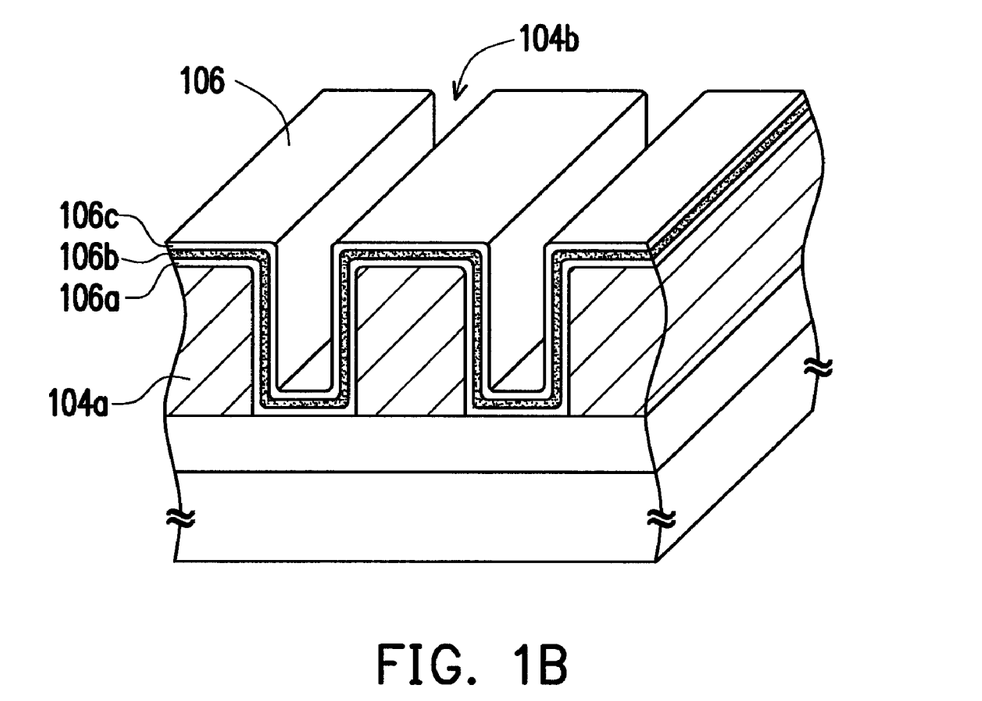

As shown in FIG. 1B, a patterning process is performed to pattern the conductive layer 104 into several word lines 104a. The word lines 104a are parallel to each other and the adjacent word lines 104a are separated from each other by a trench 104b. The method for patterning the conductive layer 104 into the word lines can be, for example but not limited to, comprising steps of forming a pad layer (not shown) and a hard mask layer (not shown) on the conductive layer 104 successively and forming a patterned photoresist layer (not shown) on the hard mask layer. Thereafter, an etching process is performed to form the trenches 104b in the conductive layer 104 by using the patterned photoresist layer as a mask so as to transfer the conductive layer 104 into the word lines 104a, and then the patterned photoresist layer, the hard mask layer and the pad layer are removed.

Then, as shown in FIG. 1B, a charge trapping structure 106 is formed over the substrate 100 to completely cover the word lines 104a. The charge trapping structure 106 is conformal to the word lines 104a. The charge trapping structure 106 can be, for example but not limited to, a stacked layer having a dielectric layer 106a, a charge trapping layer 106b and a dielectric layer 106c, stacking from the bottom to the top of the stacked layer. The dielectric layer 106a can be, for example, made of silicon oxide. The dielectric layer 106c can be, for example, made of silicon oxide. The charge trapping layer 106b can be, for example, made of silicon nitride, material with a high dielectric constant, nano-crystal, such as silicon nano-crystal, germanium nano-crystal, or metal nano-crystal. The method for forming the charge trapping layer 106b can be, for example but not limited to, CVD or epitaxy.

Figure 1C:
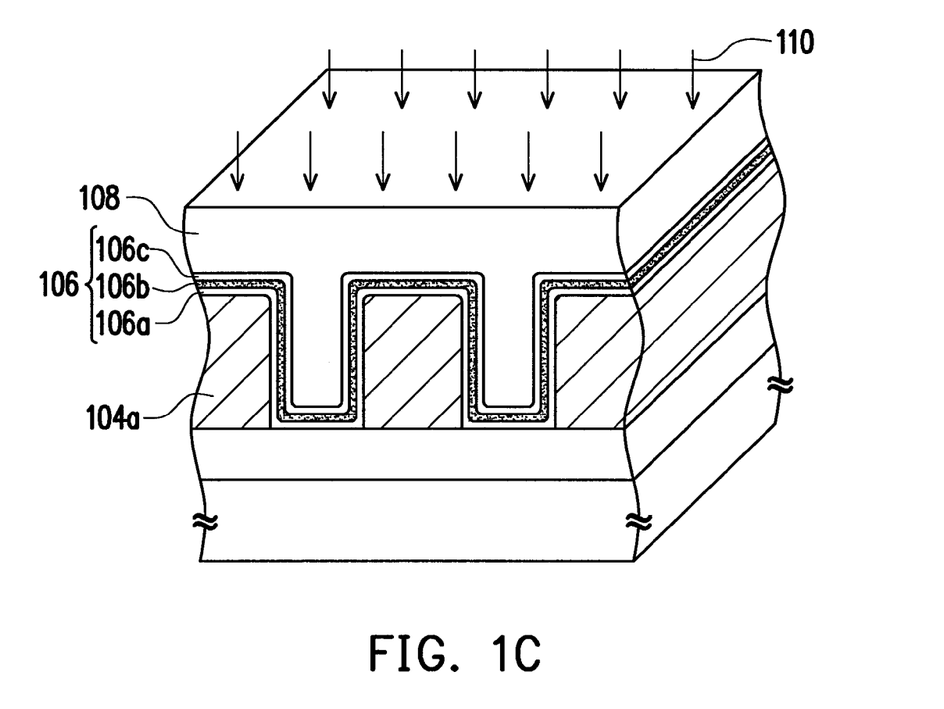

As shown in FIG. 1C, a conductive layer 108 having a first conductive type over the substrate 100 so as to fill up the trenches 104b. The method for forming conductive layer 108 can, for example, comprise steps of forming a material layer over the substrate 100 and fill up the trenches 104b and then performing an ion implantation process 110 for implanting ions with the first conductive type into the material layer so as to transfer the material layer into the conductive layer 108. The material layer can be, for example, made from single crystal by performing a metal induced lateral crystallization process. In one embodiment, the material layer can be, for example, made of polysilicon such as un-doped polysilicon. The ion implantation process 110 can be, for example, a channel doping process so that implanted ions concentrate in a portion of the conductive layer 108 which is predetermined to be the channel regions in the later formed memory cells respectively.

Figure 1D:
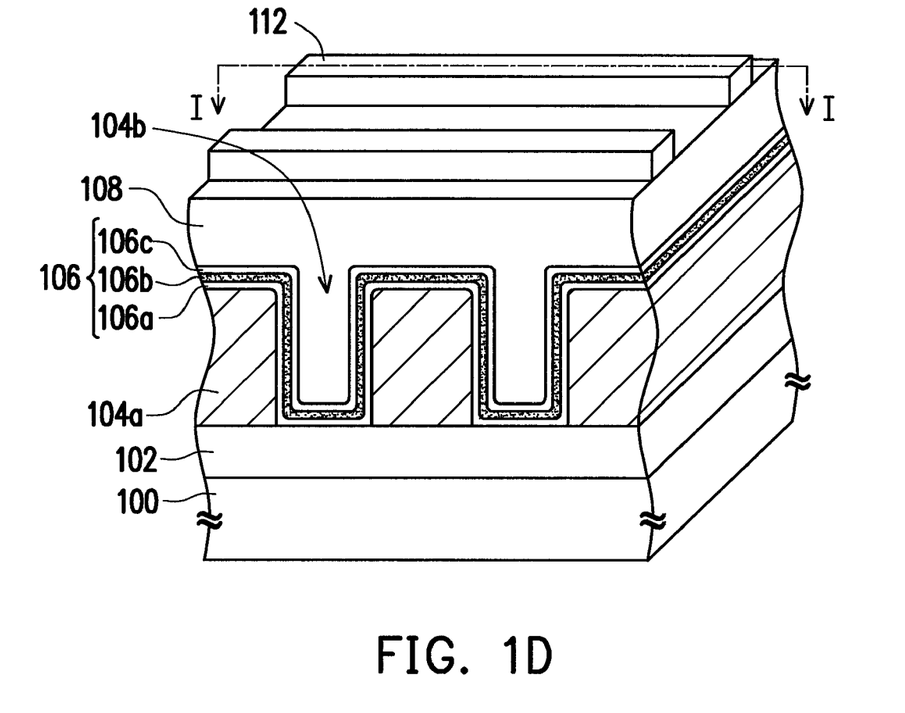
Figure 1D:
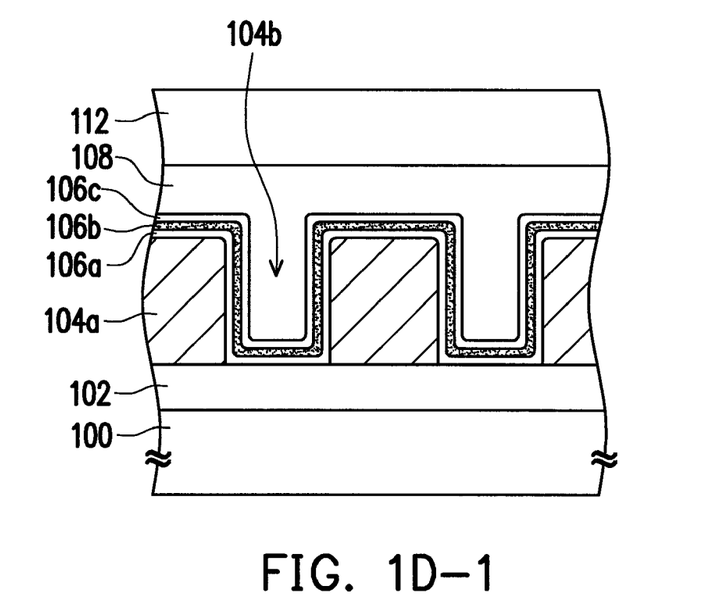
Figure 1E:
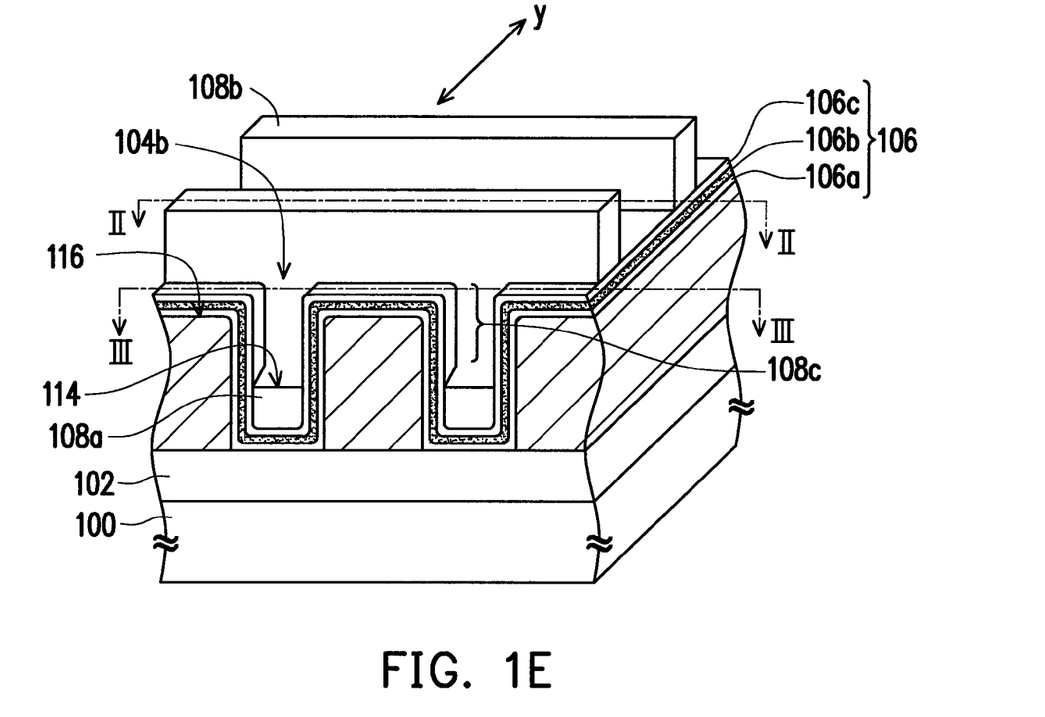
Figure 1E:
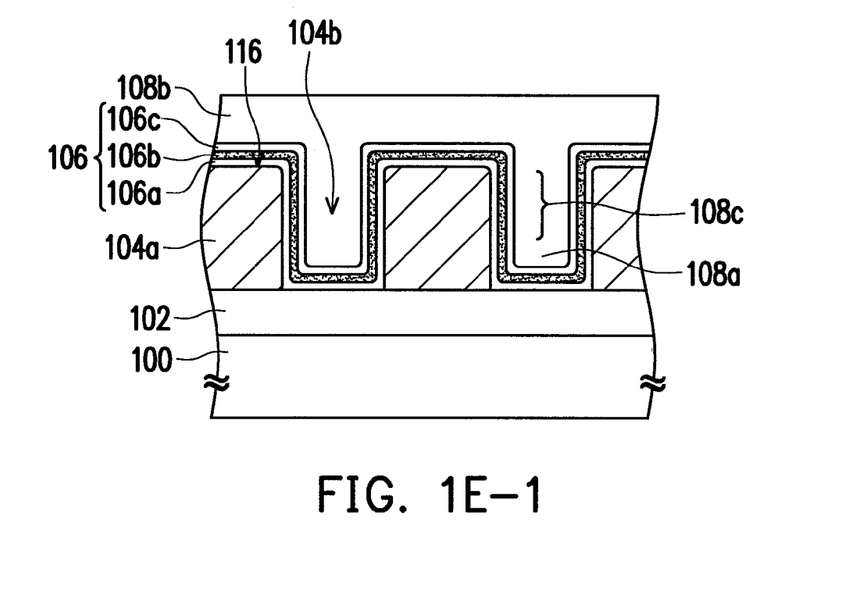
Figure 1E:
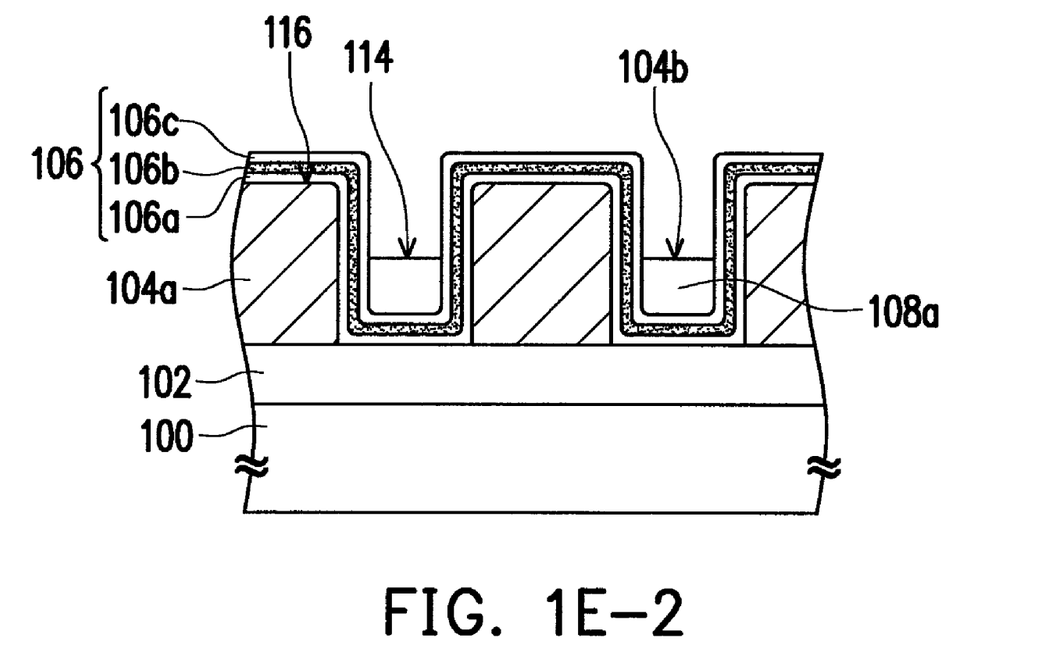

As shown in FIG. 1D and FIG. 1D-1, a patterned mask layer 112 is formed over the substrate 100. The patterned mask layer 112 can be, for example but not limited to, made of photoresist or hard mask material. As shown in FIG. 1E, FIG. 1E-1 and FIG. 1E-2, a portion of the conductive layer 108 is removed to form trench channels 108a in the trenches 104b respectively and along a longitudinal axis y of the word lines 104a, and to form conductive lines 108b over the word lines 104a and across each of the word line 104a. Then, the patterned mask layer 112 (shown in FIG. 1D and FIG. 1D-1) is removed. It should be noticed that the top level 114 of each trench channel 108a is lower than the top level 116 of each word line 104a. Furthermore, each conductive line 108b has a plurality of conductive extensions 108c extend downward in the trenches 104b respectively so as to electrically couple the conductive lines 108b to the trench channels 108a respectively. The method for removing a portion of the conductive layer 108 can be, for example, comprising steps of etching the conductive layer 108 by using the patterned mask layer 112 as mask until a portion of the charge trapping structure 106 on the top of the word lines 104a is exposed, and then performing an over etching process for further removing a portion of the conductive layer in the trenches 104b so that top portion of each of the trenches 104b is removed.

Figure 1F:
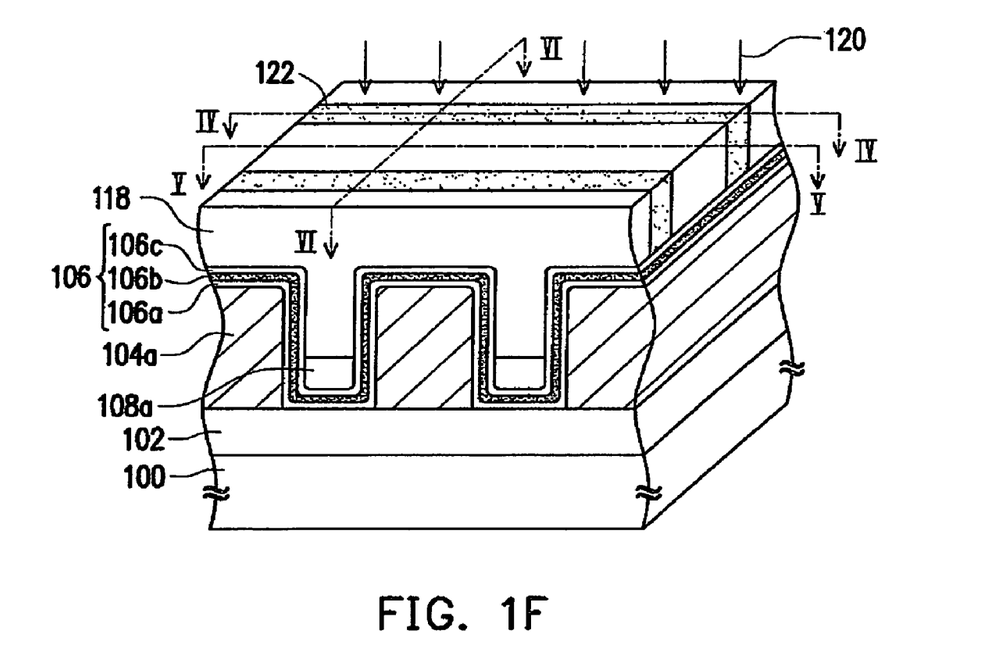

As shown in FIG. 1F, FIG. 1F-1 and FIG. 1F-2, a dielectric layer 118 is formed over the substrate 100 to cover the conductive lines 108b and the trench channels 108a and further to fill up the removed portions of the trenches 104b. The dielectric layer 118 can be, for example but not limited to, made from silicon oxide by, for example, high density plasma CVD. The dielectric layer 118 is used as the bit line isolation. Thereafter, a planarization process is performed to remove a portion of the dielectric layer 118 until the top surfaces of the conductive lines 108b are exposed. The planarization process can be, for example, a chemical mechanical polishing. Then, an ion implantation process 120 is performed in order to transfer the conductive type of each conductive line 108b into a second conductive type and the conductive type of a portion of each conductive extension 108c near the conductive line 108b are also transferred into a second conductive type. Thus, the conductive lines 108b are converted into bit lines 122 respectively. It should be noticed that the first conductive type is different from the second conductive type. Accordingly, after the ion implantation process 120 is performed, a P-N junction 124 is formed in each conductive extension 108c.

Figure 1F:
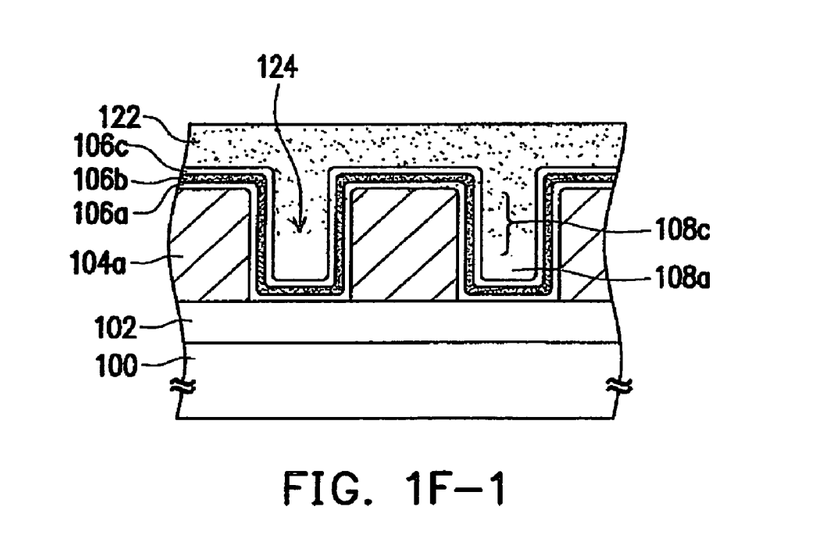
Figure 1F:
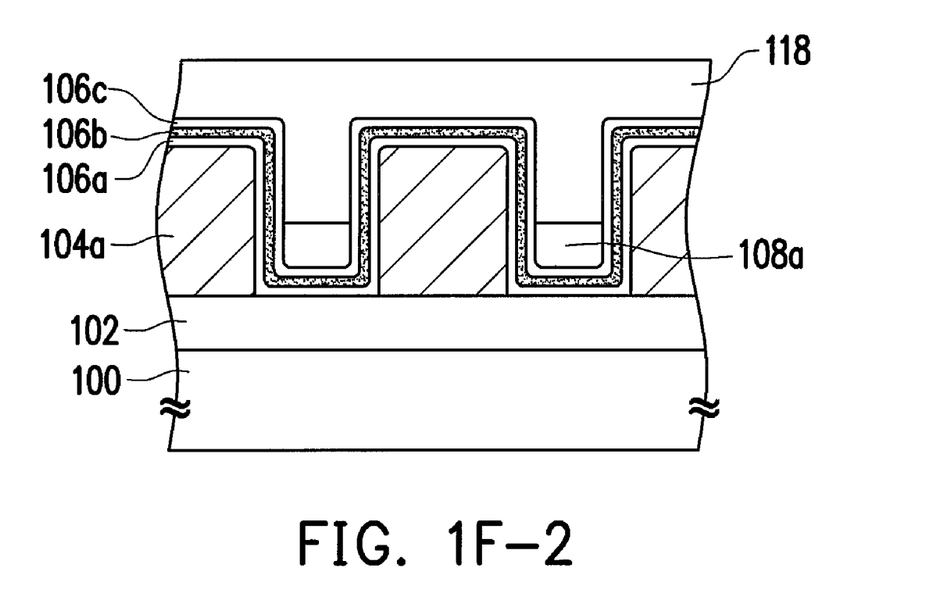
Figure 1F:
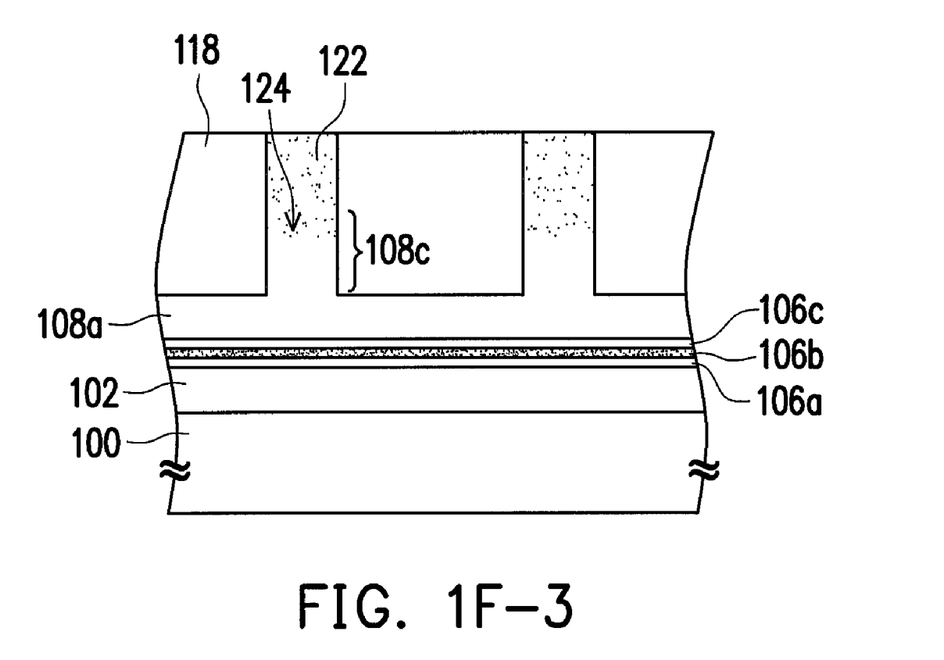

Hence, a memory array is formed. As shown in FIG. 1F-1, FIG. 1F-2 and FIG. 1F-3, it is clear that, in the memory array of the present invention, the channel region of each memory cell in the memory array includes the trench channel 108a and a portion of the conductive extensions 108c under the P-N junction 124, and the channel region is located at the charge trapping structure 106 on the opposite sidewalls of the word line 104a. Because the bit line implantation process/ion implantation process 120 is performed after the trench channel 108a is formed, the channel length can be adjusted by controlling the implantation parameters. That is, the location of the P-N junction 124 within each of the conductive extensions 108c can be controlled so as to control the channel length of each memory cell. Therefore, the channel length does not be limited by the decreased size of the memory cell by controlling the location of the P-N junction 124 in the conductive extension 108c in the trench 104b.

Figure 1F:
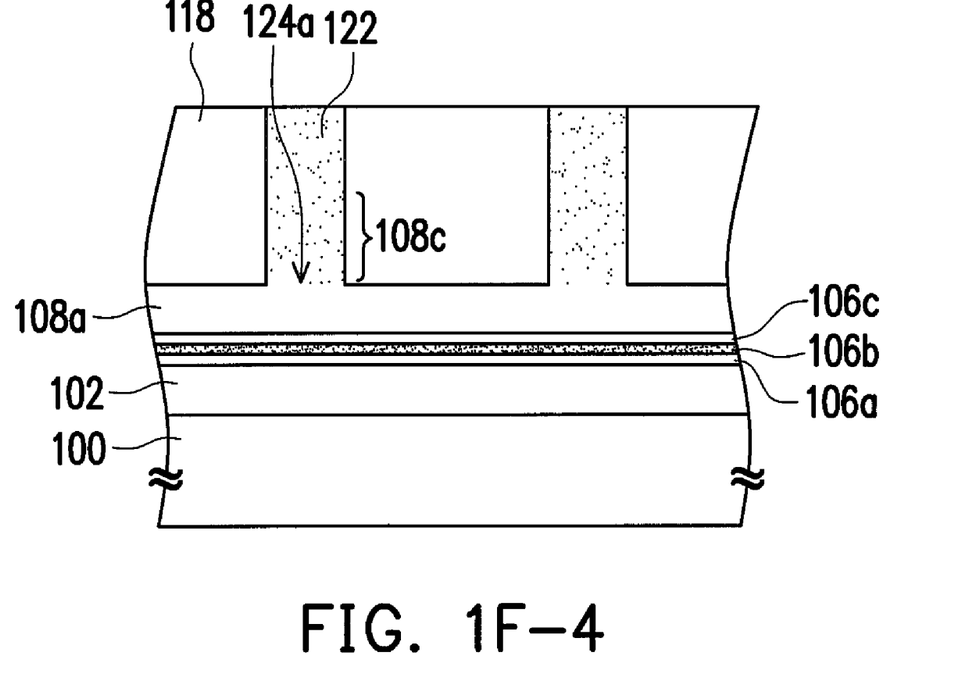

In one embodiment, the location of the P-N junction can be adjusted to be at the boundary between each conductive extension 108c and the trench channel 108a by controlling the implantation parameters. That is, the channel between the channel region of each memory cell in the memory array lies on the charge trapping structure 106 at the bottom of the trench 104b between the P-N junctions 124a (as shown in FIG. 1F-4).

Figure 2:
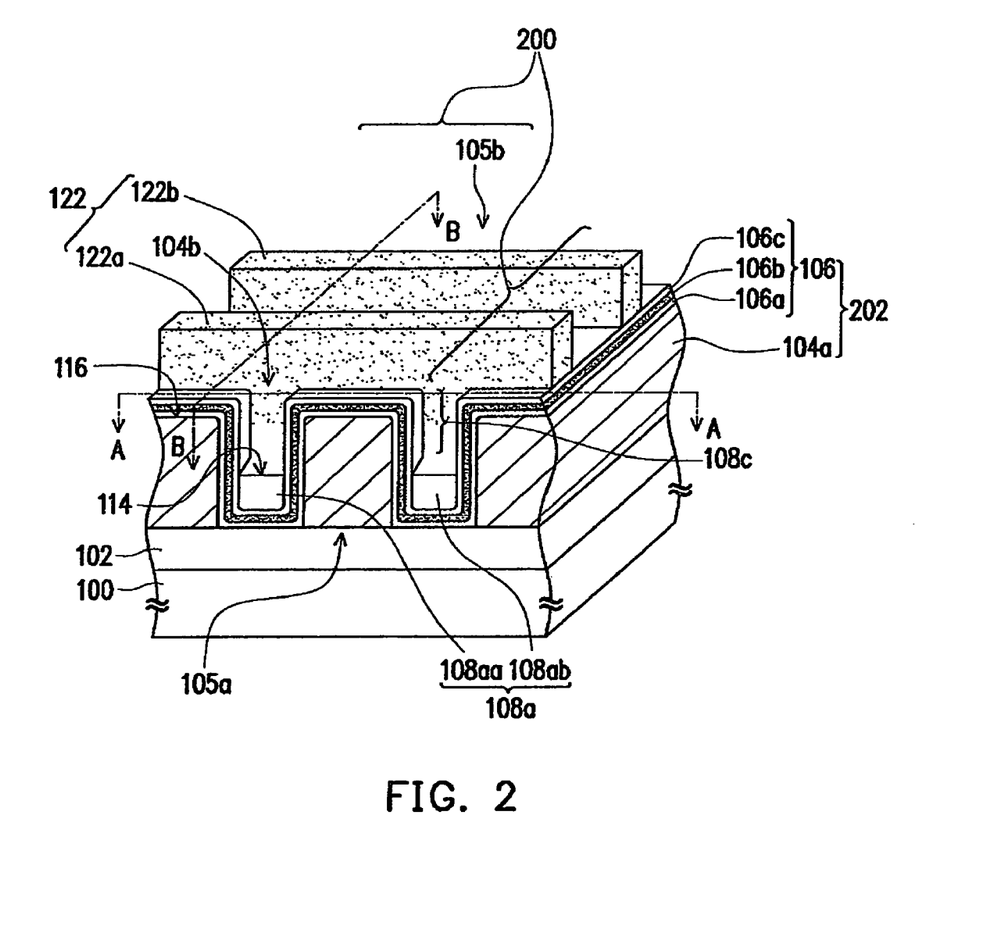
FIG. 2 is a schematic three-dimensional-perspective view of a memory array according to one embodiment of the present invention.
Figure 2A:
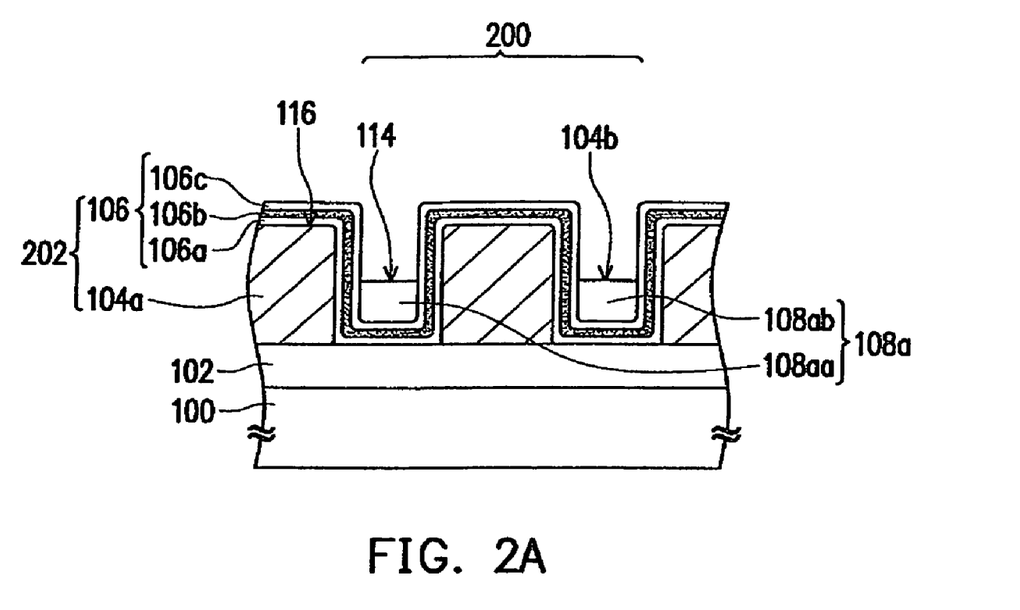
FIG. 2A is a schematic cross-sectional view along the line A-A on FIG. 2.
Figure 2B:
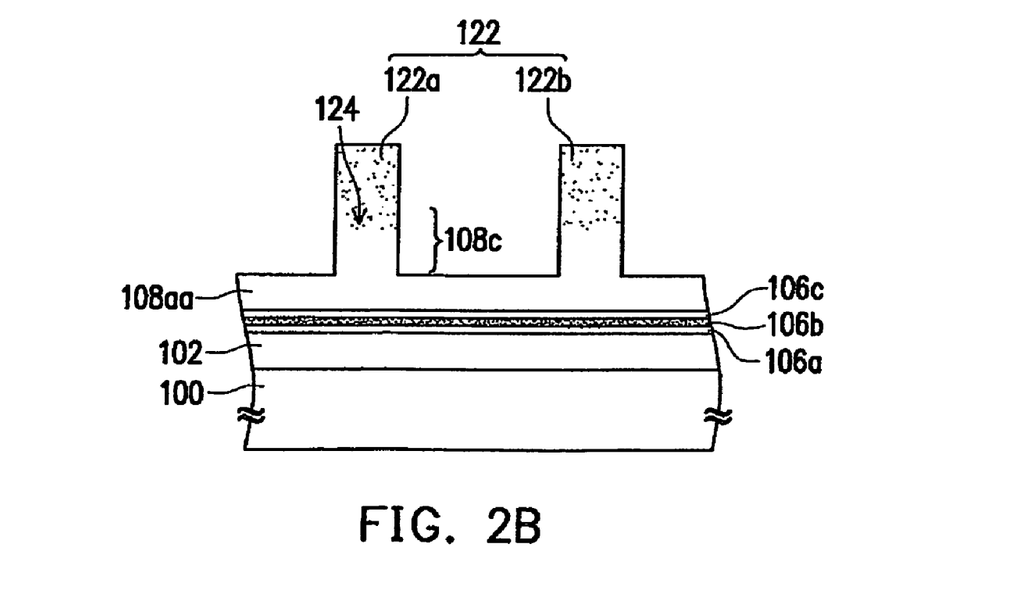
FIG. 2B is a schematic cross-sectional view along the line B-B on FIG. 2.

Moreover, the following is the description of the structure of the memory array. FIG. 2 is a schematic three-dimensional-perspective view of a memory array according to one embodiment of the present invention. FIG. 2A is a schematic cross-sectional view along the line A-A on FIG. 2. FIG. 2B is a schematic cross-sectional view along the line B-B on FIG. 2. As shown in FIG. 2, FIG. 2A and FIG. 2B, the memory array comprises the substrate 100 and several word line structures 202. Each of the word line structures 202 comprises a word line 104a and a charge trapping structure 106 covering the word line 104a. The word lines 104a are located over the substrate 100 and the word lines 104a are parallel to each other. The memory array further comprises several trench channels 108a and several bit lines 122. The trench channels 108a are located over the substrate 100 and the word lines 104a and the trench channels 108a are alternatively arranged. Furthermore, each trench channel 108a is separated from the adjacent word lines 104a by the charge trapping structure 106. The bit lines 122 are located over the word lines 104a and each bit line 122 is across over each of the word lines 104a. Also, each trench channel 108a is electrically coupled to the bit lines 122. It should be noticed that the top level of each trench channel 108a is lower than the top level of each word line 104a.

Additionally, following is the description of the structure of a memory cell in the memory array of the present invention. As shown in FIG. 2, FIG. 2A and FIG. 2B, the memory cell 200 comprises the substrate 100, the word line structure 202 including the word line 104a and the charge trapping structure 106. The word line 104a is located over the substrate 100 and the word line 104a has a first end 105a and a second end 105b. Moreover, the charge trapping structure 106 covers both sidewalls of the word line 104a. The memory cell further comprises a pair of trench channels 108aa and 108ab and a first bit line 122s and a second bit line 122b. The trench channels 108aa and 108ab are located on the charge trapping structure 106 at opposite sidewalls of the word line 104a respectively and near a lower portion of the word line 104a. The first bit line 122a and the second bit line 122b are located over the word line 104a and across the word line 104a. Further, the first bit line 122a electrically couples each trench channel adjacent to the first end 105a and the second bit line 122b electrically couples each trench channel adjacent to the second end 105b.

It should be noticed that each of the first bit line 122a and the second bit line 122b electrically couples each trench channel through the extension portion (i.e. the conductive extension 108c) of the corresponding bit line located on each sidewall of the word line 104a. Also, for each extension portion of the bit line, there is a P-N junction 124 in the extension portion of the bit line. In one embodiment, as shown in FIG. 1F-4, each of the P-N junctions 124a is located between each of the conductive extensions 108c and the trench channel 108a.

Figure 3:
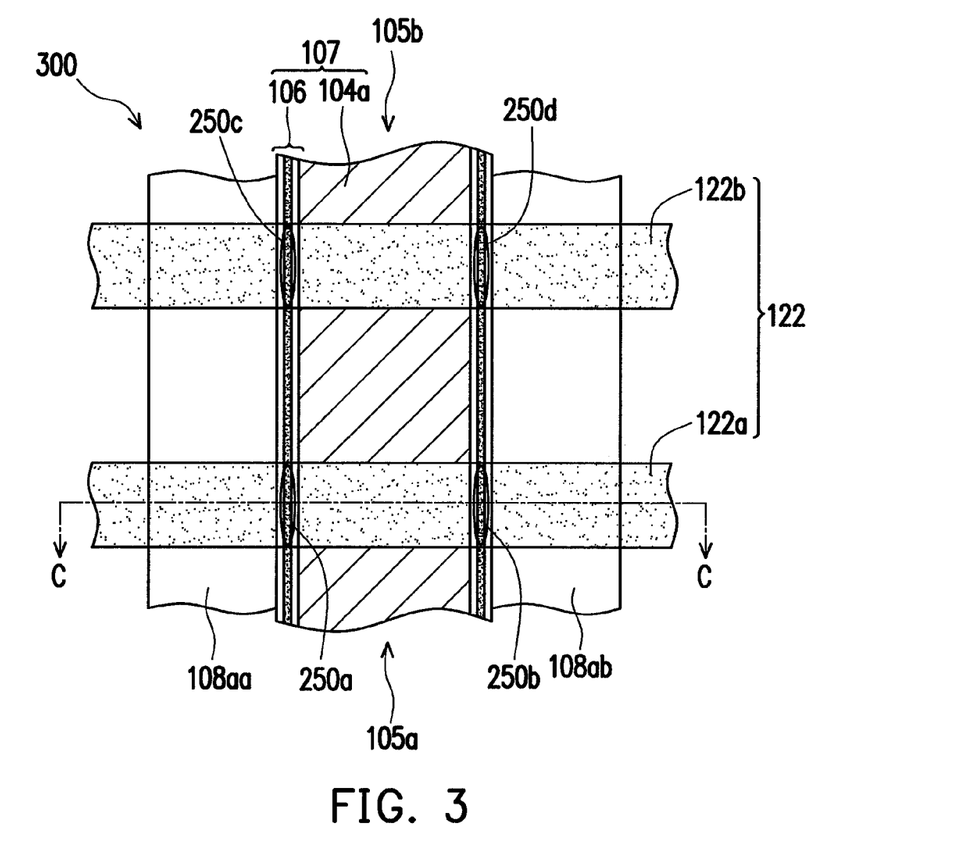
FIG. 3 is a schematic perspective top view of a memory cell according to one embodiment of the present invention.
Figure 3A:
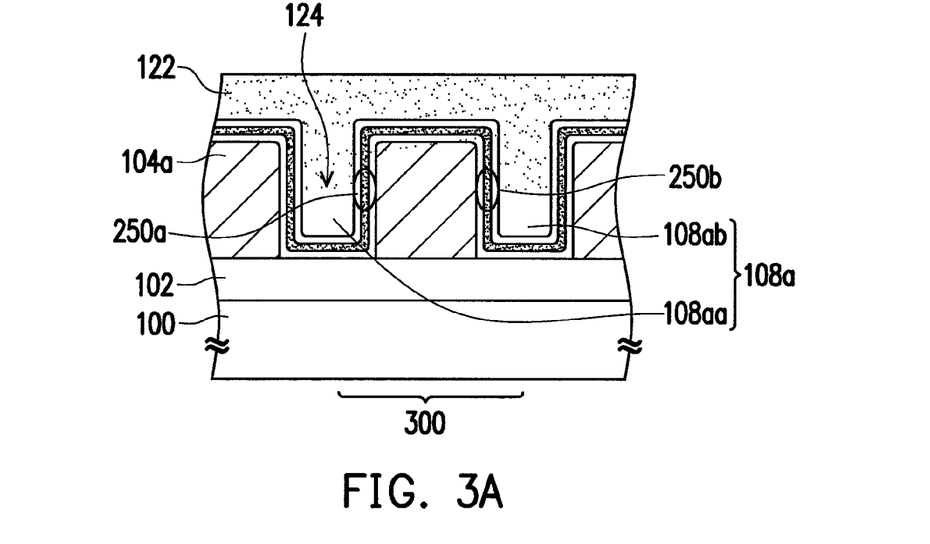
FIG. 3A is a schematic cross-sectional view along the line C-C on FIG. 3.

The method for operating the memory cell of the present invention is described herein. FIG. 3 is a schematic perspective top view of a memory cell according to one embodiment of the present invention. FIG. 3A is a schematic cross-sectional view along the line C-C on FIG. 3. As shown in FIG. 3 and FIG. 3A, the memory cell 300 includes a word line structure 107 located over the substrate 100 and two trench channels 108aa and 108ab located on opposite sidewalls of the word line structure 107 respectively. The memory cell further includes the first bit line 122a and the second bit line 122b located over the word line structure 107 and across the word line structure 107. Also, the first bit line 122a is electrically coupled to the trench channels 108aa and 108ab near the first end 105a of the word line structure 107 and the second bit line 122b is electrically coupled to the trench channels 108aa and 108ab near the second end 105b of the word line structure 107. Moreover, the word line structure 107 possesses a first storage region 250a and a second storage region 250b located on opposite sidewalls of the word line structure 107 adjacent to the first end 105a respectively. The word line structure 107 further possesses a third storage region 250c and a fourth storage region 250d located on opposite sidewalls of the word line structure 107 adjacent to the second end 105b respectively.

While the programming operation is performed to store charges in the first storage region 250a and the second storage region 250b at same time, a first positive voltage is applied on the word line 104a of the word line structure 107 and a second positive voltage is applied on the first bit line 122a, and the second bit line 122b is grounded so as to inject electron carriers into the a portion of the charge trapping structure 106 of the word line structure 107 near the first end 105a. That is, the injected carriers generated from the first bit line to the second bit line are simultaneously stored in the first storage region 250a and the second storage region 250b respectively. It should be noticed that the position of each of the first storage region 250a, the second storage region 250b, the third storage region 250c and the fourth storage region 250d is around the P-N junction 124 within each conductive extension 108c. On the other words, the carriers are injected into the storage region near the P-N junction.

Further, the memory cell is programmed in a way of channel hot electron injection programming process while the first voltage is of about 9~13 voltage. The second voltage can be a positive bias and the second bit line is grounded.

When both the first storage region and the second storage region are at a programmed state, an erasing operation on a memory cell can be performed to erase the carriers stored in the first storage region and the second storage region. The programmed state is a state of the storage region with at least one carrier is stored therein. The erasing operation can be accomplished by applying a negative voltage on the word line 104a of the word line structure 107, applying a positive bias on the first bit line 122a, and grounding the second bit line 122b.

Noticeably, the memory cell is erased in a way of band-to-band-tunneling hot hole process while the negative voltage applied on the word line 104a is about −5~−10 voltage. That is, the band-to-band hot hole are generated around the junction of the first bit line or the second bit line to inject into the first storage region and the second storage region at the same time near the first end of the word line structure when the memory cell is erased.

Furthermore, the memory cell is read by applying a positive voltage on the word line 104a of the word line structure 107 and applying a positive bias on the second bit line 122a, and grounding the first bit line 122b so as to read a storage state of the first storage region 250a and the second storage region 250b.

In one embodiment, the memory cell is read in a way of reverse read process while the voltage applied on the word line 104a is a positive bias.

In the present invention, by controlling the position of the P-N junction in the conductive extension, the channel length can be effectively elongated in a restricted and small size of memory cell. Therefore, the operating current of the memory cell can be greatly increased without being limited by the decreased size of the memory cell and the operation speed is increased as well. Furthermore, in the present invention, the source/drain region (i.e. the portion of the conductive extension above the P-N junction) is raised with a level above the channel region including the trench channel. Accordingly, by adopting the source/drain with the three dimensional arrangement as shown in the present invention, the unexpected punch through is no longer a problem even if the ion implantation dosage for forming the bit lines is increased in such limited size of memory cell in order to decrease the bit line resistance.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What claimed is:

1. A memory array comprising:
    a plurality of word lines;
    a charge trapping structure covering a surface of each of the word lines;
    a plurality of trench channels, wherein the word lines and the trench channels are arranged parallel with each other and alternately arranged along a horizontal direction and each trench channel is separated from the adjacent word lines by the charge trapping structure; and
    a plurality of bit lines located across the word lines, wherein the trench channels are electrically coupled to the bit lines.

2. The memory array of claim 1, wherein the word lines are isolated from the substrate by a dielectric layer formed on the substrate.

3. The memory array of claim 2, wherein the trench channels are isolated from the substrate by the dielectric layer.

4. The memory array of claim 2, wherein the material of the dielectric layer includes silicon oxide.

5. The memory array of claim 1, wherein a top level of each trench channel is lower than a top level of each word line.

6. The memory array of claim 1, wherein the charge trapping structure includes a charge trapping layer.

7. The memory array of claim 6, wherein the material of the charge trapping layer includes a silicon nitride.

8. The memory array of claim 1, wherein a first conductive type of the bit lines is different from a second conductive type of the trench channels.

* * * * *